United States Patent

Nakatani et al.

Patent Number: 6,096,411
Date of Patent: Aug. 1, 2000

[54] CONDUCTIVE PASTE COMPOSITION FOR VIA HOLE FILLING AND PRINTED CIRCUIT BOARD USING THE SAME

[75] Inventors: Seiichi Nakatani, Hirakata; Kouji Kawakita, Joyo; Tatsuo Ogawa, Amagasaki, all of Japan

[73] Assignee: Matsushita Electric Industrial Co., Ltd., Japan

[21] Appl. No.: 09/038,625

[22] Filed: Mar. 12, 1998

[30] Foreign Application Priority Data

Mar. 14, 1997 [JP] Japan ................................. 9-060568

[51] Int. Cl.$^7$ ....................................................... B32B 3/00
[52] U.S. Cl. ........................... 428/209; 428/901; 174/250; 174/257; 174/262
[58] Field of Search ..................... 428/209, 901, 428/210; 174/257, 262, 250

[56] References Cited

U.S. PATENT DOCUMENTS

| | | | |
|---|---|---|---|
| 4,946,733 | 8/1990 | Seeger, Jr. .............................. | 428/209 |
| 5,117,069 | 5/1992 | Higgins, III ............................ | 174/261 |
| 5,326,636 | 7/1994 | Durand et al. .......................... | 428/323 |
| 5,481,795 | 1/1996 | Hatakeyama et al. .................... | 29/852 |
| 5,698,015 | 12/1997 | Mohri et al. ............................ | 428/210 |
| 5,733,467 | 3/1998 | Kawakita et al. ........................ | 216/18 |

FOREIGN PATENT DOCUMENTS 54-38562  3/1979  Japan .
63-47991  2/1988  Japan .

*Primary Examiner*—Cathy F. Lam
*Attorney, Agent, or Firm*—Wenderoth, Lind & Ponack, L.L.P.

[57] ABSTRACT

The invention related to a paste for via hole filling which enables inner via hole connection between electrode layers without employing through hole plating techniques, and a multi-layered printed circuit board using the same. The conductive paste composition of the invention comprises a) 70–90 wt % of copper particles of an average particle size of 0.5–8 μm; b) 0.5–15 wt % of insulating particles of an average particle size of 8–20 μm; and, c) 6–17 wt % of heat setting type liquid epoxy resin, in order to exhibit low viscosity and low volatility. The conductive paste is printed and filled into through holes passing through a laminated substrate which is provide with copper foils on both sides thereof, to form a printed circuit board in which the via holes are electrically connected after thermosetting. By adding insulating particles of large particle size, the amount of copper particles to be added is decreased so that a via hole connection of low specific resistance and high reliability is obtained, and improvements in a decrease of viscosity and continuous printability of the paste itself can be achieved.

14 Claims, 3 Drawing Sheets

CONDUCTIVE PASTE COMPOSITION FOR VIA HOLE FILLING AND PRINTED CIRCUIT BOARD USING THE SAME

FIELD OF THE INVENTION

The present invention pertains to the field of electronic materials and elements, and relates to a conductive paste composition being filled into via holes of a substrate for forming interconnected electrodes and further to printed circuit boards using the same.

BACKGROUND OF THE INVENTION

In recent years, printed circuit boards are required to exhibit high packaging density of the electronic devices and to be of multi-layered structure, accompanying improvements in performance and downsizing of electronic appliances. A through hole connection method and an inner via hole connection method are known as methods for providing electric interlayer connection between layers of a substrate within which electric connecting among LSIs or other components can be realized at shortest distances.

The through hole connection method, which is employed for general glass reinforced epoxy multi-layered substrates, presents a drawback in that there are restrictions that make it difficult to obtain packaged elements of high density due to the following reasons: electric connection between layers is provided through plating a conductive metal inside through holes so that it is difficult to provide connection only with specific electrodes between layers that are required, and the substrate is generally arranged with a land of electrodes on the uppermost layer of the substrate, a land of electrodes for surface-mounted elements can not be formed on this portion of the land on the side of the substrate.

In order to solve these problems, a method has been proposed in which the number of full through holes can be reduced by making holes extend a half-depth of a laminated substrate. In another method, through holes are blocked on the uppermost layer of a substrate in a process of filling conductive paste with through holes and plating them thereafter to improve the packaging density (e.g. Japanese Patent Publication No. 54-38562; however, their complicated manufacturing processes results in drawbacks in terms of costs and mass production.

In contrast, inner via hole connection is a method in which arbitrary inter-layered electrodes in a multi-layered substrate or printed board are connected at arbitrary positions and is known to provide circuit connection of highest density. The inner via hole connection advantageously makes it possible to connect only specific layers as required, and no through holes may be provided on the uppermost layer of a substrate, and further it is superior in terms of packaging ability (e.g. U.S. Pat. No. 5,481,795, Japanese Patent Application No. 61-191606 (1986)). Applying this method of connection to a resin substrate (for instance, a glass epoxy substrate), a solvent-type silver paste with low viscosity is filled into through holes by printing, which is then dried for curing to continuity. However, the via hole conductors in the obtained substrate present a high specific resistance of approximately $10^{-3}$ $\Omega$·cm, and it still poses problems in terms of reliability of the conductors or the printed board related to heat impact resistivity such as heat cycle.

In the inner via hole method, via hole conductors are formed by filling conductive paste into via holes through printing, wherein the conductive paste is required to have a low viscosity to enable easy filling. For this purpose, methods have been conventionally taken to decrease the amount of conductive particles in the paste, to employ large conductive particles for decreasing the specific surface area of the particles or to add a solvent or a reactive diluent of low boiling point into the paste (e.g. U.S. Pat. No. 5,326,636).

However, decreasing the amount of conductive filler to be added or employing large particles for obtaining a low viscosity of the paste resulted in lesser contact points of conductive fillers and higher connection resistance of the via holes, and in an environment in which thermal stress such as heat cycle repeatedly generates in the substrate, no reliability of the via hole connection could be secured.

In a method in which a solvent or reactive diluent of low boiling point is added, volatilization of their components during curing with heat press resulted in a large weight loss and drawbacks were presented in that these volatile components caused blisters in the substrate or in that the adhesiveness with connecting copper foils was poor. Further, during many times of printing the paste, only resin components in the paste affixed to printing masks in a film-like manner whereby a composition shift of the paste was caused, and the resulting increase in paste viscosity made continuous printing impossible.

SUMMARY OF THE INVENTION

An object of the present invention is to provide a paste composition of low specific resistance for use in inner via hole conductors that are formed by filling the paste into inner via holes formed on a circuit board, to secure electric connection between interlayer electrodes through these inner via hole conductors and further to improve the heat impact resistivity of the inner via hole conductors.

Another object of the present invention is to provide a conductive paste for inner via hole filling having low viscosity, low volatility, and high continuous printability.

Further another object of the present invention is to provide a solvent containing conductive paste having low viscosity and low volatility, and being capable of preventing deficiencies such as blisters from occurring in substrates or via hole conductors.

It is another object of the present invention to provide a multilayered printed circuit board with high reliability in terms of electric connectability and resistance to heat cycle shock obtained by forming reliable inner via hole conductors by using the above conductive paste.

In summary, according to the present invention, the paste for via hole conductors is a conductive composition obtained by dispersing fine-grained copper particles and coarse-grained insulating particles at fixed ratios in an epoxy-resin liquid, and this paste is intended to exhibit a high flowability by the coarse-grained insulating particles which enables one to secure a favorable printing performance and to allow easy filling of the via holes. The paste of the invention achieves a high probability of contact of the fine-grained copper particles condensed to the coarse-grained insulating particles at the time of via hole filling. And the paste causes via hole conductors to have low resistance through the contact of the fine-grained copper particles after curing.

More particularly, in the present invention, via hole conductors of high reliability are obtained by selecting two kind of fillers, that is, copper particles and insulating particles to determine each of an averaged particle size of the fillers in a specified range, mixing both of these fillers and the liquid epoxy resin at contents defined in a specified range to form a conductive composition, and filling the composition into the via holes to cure. To this end, the paste of the invention basically has a composition of (a) 70–90 wt % of copper particles of an average particle size of 0.5–8 µm, (b) 0.5–15 wt % of insulating particles of an average particle size of 8–20 µm, and (c) 6–17 wt % of heat setting type liquid epoxy resin.

The present invention further includes a printed circuit board having via hole conductors formed by filling the paste of the above composition into via holes and curing it later with heat, the via holes being pierced through one or more insulating layers of a substrate. The invention includes printed circuit substrates in which electrode layers are electrically connected with each other through the via hole conductors. The substrate has at least one or more insulating material layers and two or more electrode layers on the surfaces or between the layers, and forms a multilayered printed board for which connection of the via holes is performed through conductors of cured paste.

BEST MODE FOR CARRYING OUT THE INVENTION

Figure 1:
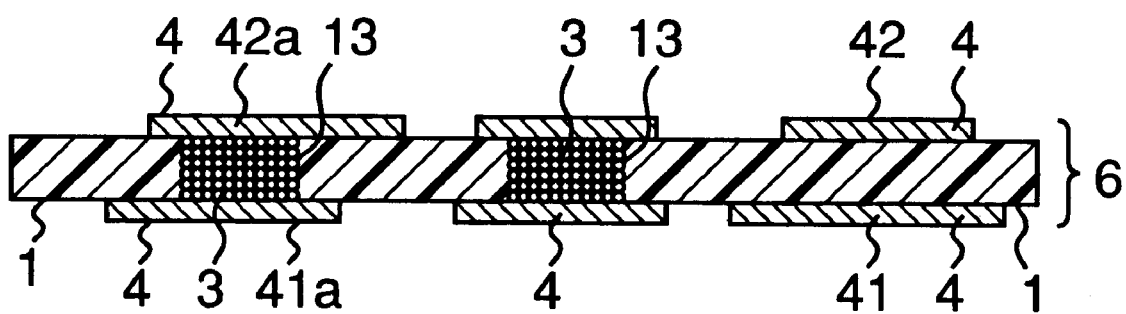
FIG. 1 is a sectional diagram showing a double-sided printed board according to an embodiment of the present invention.

In the paste of the present invention, copper particles as conductive fillers produce conductivity in via hole conductors through mutual connection of the particles, and the conductive fillers are required to be contained at a high density within the paste composition in the present invention. The amount of copper particles is set to be in a range between 70–90 wt %. This range of copper content makes it possible to achieve a high degree of contact in the conductive particles and a small specific resistance for the via hole conductors, securing electric connection in case that strains are applied to the substrate due to thermal or mechanical stress. When the value is less than 70 wt %, the contact degree of the conductive particles becomes low so that the specific resistance can not be made low, and when it is more than 90 wt %, resin components in the cured paste decrease so that no satisfactory bonding strength can be obtained.

In order to obtain such a low specific resistance and high reliability, the particle size of the copper particles must no be too large, otherwise the probability of mutual contact decreases. On the other hand, as the particle size is too small, a rise in specific surface area results in an increased viscosity and curing so that the viscosity of the paste increases or printing becomes difficult. For this reason, the average particle size required for the copper particles is in the range of 0.2–8 µm, whereby the conductive fillers can be dispersed at a high density.

It is preferable that the specific surface area of the copper particles be relatively small in order to restrain the paste viscosity from rising, and on the assumption that the average particle size is in the above-mentioned range of 0.2–8 µm, the specific surface should be 0.1–1.5 $m^2/g$, and more preferably, 0.1–1.0 $m^2/g$.

Copper particles may be of any shape (spherical, flake-like, etc.) if they exhibit the above-described properties. Although Cu particles are favorably used as conductive fillers in terms of restriction of migrations, economical availability and stability of price, copper powder is generally apt to be subjected to surface oxidation. Since an oxidized film on copper powder hinders the conductivity of the via hole conductors, the oxygen concentration of the copper powder surface is preferably less than 1.0% in the present invention.

Next, the insulating particles in the paste are prepared to have a larger particle size than the Cu particles. When they are dispersed in the paste in the presence of the copper particles for securing conductivity, the insulating particles, which are the larger particles, cause displacement of the copper particles whereby the displaced the copper particle groups increases in contact probability. Consequently, inner via hole conductors can be realized to obtain small connection resistance. In other words, by the addition of insulating particles which particles are more coarse than the copper particles, the amount of added fine-grained copper particles, by which viscosity is determined, can be decreased. Further, due to the large particle size of the insulating particles, a part of the copper particles may be substituted by these insulating particles without decreasing the contact probability of the copper particles and still achieving a decrease in viscosity.

The insulating particles preferably have an average particle size in a range of 8–20 µm, and the amount of addition is preferably 0.5–15 wt % to the above-mentioned amount of addition of the copper particles. The addition of insulating particles also has an effect of improving the stability of the paste viscosity at the time of continuous printing. That is, the filling of a conductive paste to via holes provided in an insulating substrate is performed by employing a mask or a printing screen for filling only specified via holes and by printing the paste thereon by means of a squeegee or the like. In doing so, only the resin components in the paste adheres and remains on the mask surface as a resin film so that during printing with the same paste repeatedly, the past changes in composition ratio of the filler portion and resin portion. Consequently, the paste viscosity gradually increases at the time of printing and finally becomes too hard for further printing. In contrast to such a conventional paste, the paste according to the present invention is capable of limiting a rise in viscosity resulting from a decrease in the amount of contained resin, since the specific surface area of the whole particle filler components is made to be small by the addition of insulating particles that are of large particle size. It is preferable that the insulating particles that exhibit this effect may be of an average particle size of 8–20 $\mu$m, and be added at an amount of 0.5–15 wt %.

The insulating particles may be either of inorganic materials or of organic materials, wherein the inorganic materials may especially be non-metallic inorganic materials such as metal oxide particles, glass particles or ceramic particles. Preferably used insulating particles are oxide particles such as silicon oxide ($SiO_2$), aluminum oxide ($Al_2O_3$), calcium oxide (CaO) or magnesium oxide (MgO).

Synthetic resin may also be used as an organic material for the insulating particles, and since such synthetic resin is required to have a sufficient hardness for displacing the copper particles to gather into copper particle groups within the paste during a laminating process of the substrate layers through thermosetting the resin, preferably the resin material has a softening point of more than 100° C., and more preferably, more than 150° C. In this respect, the resin may be a synthetic resin such as silicone resin, polyisocyanate resin, polyimide resin, aromatic vinyl resin (such as polystyrene or polydivinyl-benzene) or acrylic resin(preferably polymethyl methacrylate).

In the present invention, the surface of the insulating particles are preferably formed with a conductive metallic layer since they provide greater effect of further decreasing the specific resistance of the electrode conductors in the via holes. For this purpose, the insulating particles are plated or deposited with a metal such as gold Au, copper Cu or nickel Ni, and the metallic layer on the insulating particles can contact to the copper particles so that an increase in contact probability due to the aggregation of the copper particles and also in their own surface conductivity results in a further decrease of the entire connection resistivity of the via hole conductors.

For forming a conductor composition of single liquid non-solvent type with a single liquid, an epoxy based liquid resin is generally used. The liquid epoxy resin in the paste is provided for dispersing the fillers of the copper particles and insulating particles described above in order to apply required flowability to the paste for printing and filling, and for mutually fitting the above filler particles the via holes through curing after filling there.

The amount of liquid epoxy resin contained in the paste is suitably 6–17 wt %. As the value is less than 6 wt %, a high viscosity of the paste presents a drawback in terms of applicability to printing, and since adhesiveness with a substrate material or electrode layer can not be ensured, it becomes difficult to restrain fluctuations in values for the conductor resistivity accompanying thermal impacts such as heat cycles. On the other hand, as the amount of liquid epoxy resin contained in the paste exceeds 17 wt %, the copper particles tends to decrease in contact probability and increase in specific resistance of the cured conductors.

For dispersing the conductive fillers of the above-described combination at a high density, the viscosity of the epoxy resin is required to be less than $15 \times 10^3$ cps, and in case that an epoxy resin of a viscosity exceeding this value is employed, the viscosity of the paste obtained from the conductive composition remarkably increases to more than $2 \times 10^6$ cps and thus makes operation of filling via holes difficult.

The liquid epoxy resin may be a bisphenol A type epoxy resin, bisphenol F-type epoxy resin, alicyclic epoxy resin or an amine type epoxy resin each of which contains more than two epoxy groups in a molecule, and it is preferable to use a polyfunctional group liquid epoxy resin having more than three epoxy groups.

Further, for limiting the amount of volatilization, a liquid epoxy resin which has undergone molecular distillation may also be used.

An epoxy compound obtained by esterifying a dimeric acid by glycidyl group presents low viscosity as an uncured resin and a superior flexuosity and a large relaxation effect against stress after curing. Adding such an epoxy compound by more than 10 parts by weight to the epoxy resin causes the via hole conductor structure to improve the reliability.

In the present invention general curing agents for curing liquid epoxy resin may be used. Representative examples of the curing agents are: an amine based curing agent such as dicyandiamide or hydraxide carboxylate; an urea based curing agent such as 3-(3,4-dichlorophenyl)-1 or 1-dimethyl urea; an acid anhydride based curing agent such as phthalic anhydride, methyl nadic anhydride, pyromellitic anhydride or hexahydrophthalic anhydride; or an aromatic amine based (amine adduct) curing agent such as diaminodiphenyl-methane or diaminodiphenyl sulfonic acid.

In these curing agents, a solid type latent curing agent that is preliminarily filled and included in minute capsules are desirable in the aspect of storage stability of the paste composition and filling or printing operability of the paste. The curing agents mixed with the above-described insulating particles are more advantageous for via hole connection.

It is preferable to add a solvent to the paste composition of the present invention and the solvent should be dissolved in the paste to adjust its viscosity and flowability. The paste composition of the present invention is required to restrain its volatile components so that no void is generated in the structure of the conductor which is filled in the via holes or no delamination of prepregs is caused due to volatilization of the components during the heating and pressing processes after being filled into the via holes. While it is desirable to keep the amount of volatilization as small as possible, no inconveniences occur when the amount of the volztile cmponents is less than 2.0% in the composition. Therefore, as long as the amount of solvent, which is a representative example of volatile components, is less than 2.0% in the composition, no problems are caused in actual usage, and the appropriate amount of the solvent in the composition rather exhibit the effect that not only the ability of sliding at surprinting on the mask for filling the paste composition into the via holes is improved to result in an increased printing speed, but also the amount of resin components adhering to the mask is decreased and thus being favorable for use in continuous printing.

Such effects that may be obtained by adding solvents had been conventionally known, but by adding solvents, the dispersion of conductive fillers were, in turn, too improved and conversely resulted in a decrease in contact probability of the particles. It was required to increase the amount of conductive filler by the degree the viscosity was decreased by the addition of the solvent which then resulted in worse continuous printability. In contrast, the simultaneous addition of large sized insulating particles as described above has enabled it in the present invention to secure a flowability suitable for continuous printing through a solvent and to prevent fluctuations in paste composition without decreasing the contact probability of the copper particles.

A solvent employed for the composition of the present invention preferably may be compatible with liquid epoxy resin and have a boiling point of more than 200° C. Examples of such preferably used solvents include ethyl carbitol, butyl carbitol, butyl carbitol acetate and 2-2-4 trimethylpentane diolmonoisobutylate. These solvents may serve to improve the sliding of squeegee on the mask for continuous printing when filling the paste composition to a substrate. Also, these solvents are useful to prevent occurrence of blisters in the curing paste or the substrate during heating and pressing when laminating for the substrate and the electrodes after filling via hole. It can be prevented for blisters at the time of laminating since the boiling point of the solvent is higher than the laminating temperature and the solvent hardly evaporates at the above temperature. At the stage of heat treatment performed for the purpose of relaxing the thermal stress of the substrate after lamination, the solvent can be made to gradually evaporate, and the evaporation of the solvent after curing of the substrate material does not produce any blisters.

According to the present invention, it is enabled to obtain a conductive paste composition for via hole filling that is of low viscosity and low volatility, and to easily form a multi-layered printed wiring board having superior reliability of inner via hole connection.

As the wiring substrate, a resin substrate, especially a fiber reinforced thermosetting resin sheet is employed for reinforcing the substrate. A prepreg which is preferably used for this purpose may be a glass fiber reinforced epoxy resin sheet, a paper impregnated phenol resin sheet or an aramid fiber reinforced epoxy resin sheet, and a substrate whose thickness becomes lower than the prepreg during curing at the time of pressing for lamination is desirable in terms of low resistance connection and reliability.

Examples of a multi-layered printed board employing the conductive paste for via hole filling according to the present invention will now be explained with reference to the drawings.

FIG. 1 shows a sectional view of a double-sided printed wiring board 6 which serves as a basis for manufacturing a multi-layered printed circuit board, wherein a printed board 6 is composed of a laminating material substrate 1, copper foils 4 (in the drawings shown as copper foil 41a, 42a formed in a wiring pattern) and via hole conductors 13 made of cured conductive paste 30.

The laminating base material 1 maybe a presently known resin base material as described above. In a preceding stage before performing the heating and pressing of the base material, it is called a prepreg 10 (FIG. 2(A)), and a core material of a woven or non-woven fabric which is made of glass fiber or aramid fiber is impregnated with uncured thermosetting resin. As explained above, a glass-epoxy base material (glass fiber reinforced epoxy resin sheet), an aramid epoxy base material (aramid fiber reinforced epoxy resin sheet) or a paper-phenol base material (paper impregnated phenol resin sheet) may be employed as the base material.

Figure 2A:
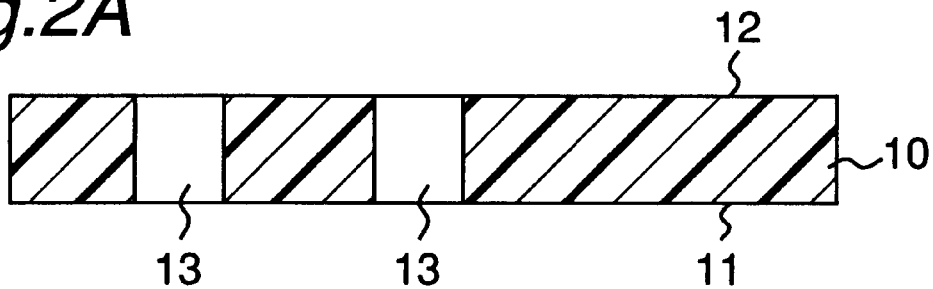
FIG. 2A is a sectional diagram of a substrate in which holes are formed to be filled by a paste, showing a process for forming the double-sided printed board according to an embodiment of the present invention.
Figure 2B:
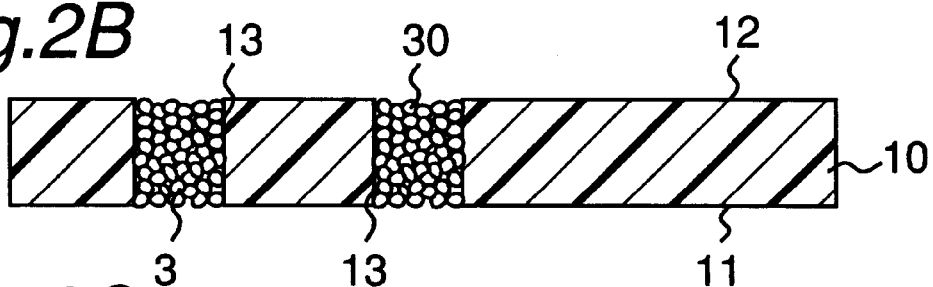
FIG. 2B is a sectional diagram of a substrate with via holes filled with a conductive paste.
Figure 2C:
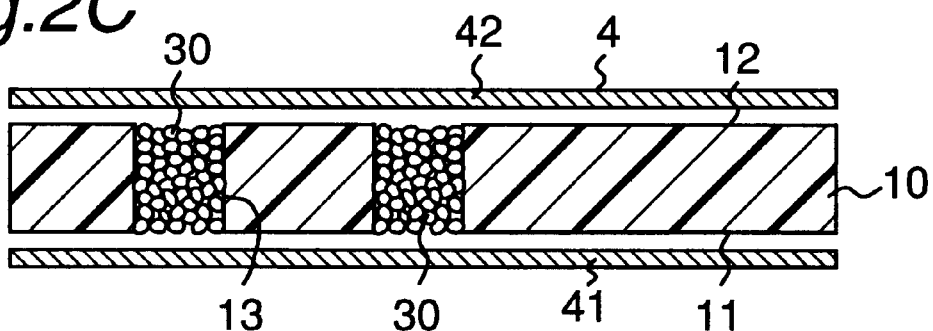
FIG. 2C is a sectional diagram of a substrate with via holes filled with a conductive paste, and two sheets of copper foil to be covered on both the sides of substrate.
Figure 2D:
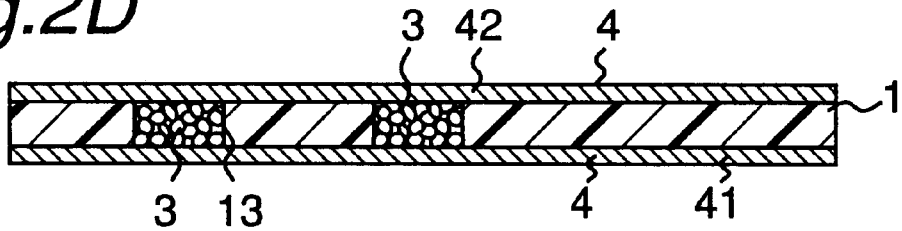
FIG. 2D is a sectional diagram of a substrate with via holes filled with a conductive paste and two sheets of copper foil integral with the substrate.

As shown in FIG. 2A, through holes 13, 13 are formed through the prepreg 10 of laminated base material to serve as via holes 13, 13. For the formation of through holes 13, 13, methods such as boring with a drill or processing holes by raser beams are used, depending on the used material. There are respectively shown different conditions in the drawings, wherein FIG. 2B shows the through holes 13, 13 being filled with the above-described conductive paste 30, FIG. 2C both sides 11, 12 of the prepreg 10 being pinched between copper foils 4, 4, and FIG. 2D copper foils 4, 4 of the prepreg 10 after thermosetting through heating and pressing with a press.

In this way, the prepreg 10 is compressed to decrease in its thickness, the base material resin is cured and joined with the copper foils 4, 4 to form substrate 1, and the through holes 13 provided in the prepreg 10 are enlarged in their size, since the metal filling amount of the paste does not change after heating and pressing, and form via hole conductors 3 after curing of the paste 30.

Figure 2E:
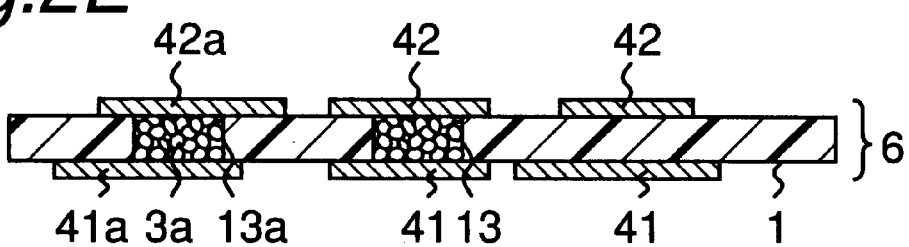
FIG. 2E is a sectional diagram of a substrate with via holes filled with a conductive paste and surface electrodes connected to the via holes.

The conductors 3 in this condition are compressed and connected to the copper foils on both upper and lower surfaces of the base material, and the upper and lower copper foils serve as electrodes to provide electric connection. As shown in FIG. 2E, desired wiring patters are formed by the surface copper foils 41, 42 by treating such as etching or the like), which are used as circuit conductors on the base material.

for actual use, the printed board undergoes further processes thereafter in which it may be applied for soldering resist, printing letters or symbols or making holes for fixing attachments thereto.

Figure 3A:
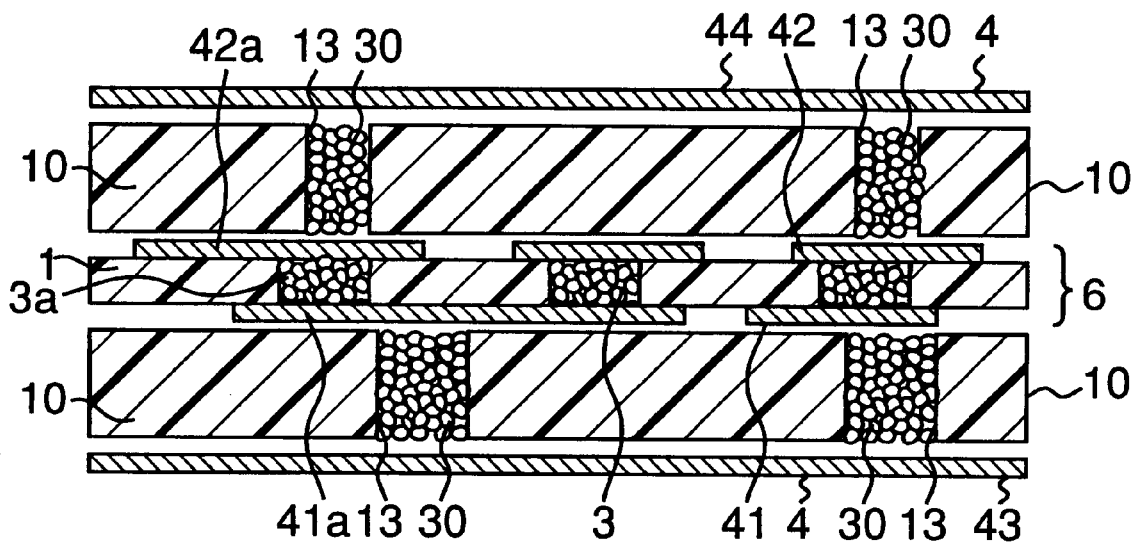
FIG. 3A is a sectional diagram of arrangement of three layers of substrates with via holes filled with a conductor paste and two sheets of copper foils before laminating, showing a method for forming a multilayered printed board according to an embodiment of the present invention.
Figure 3B:
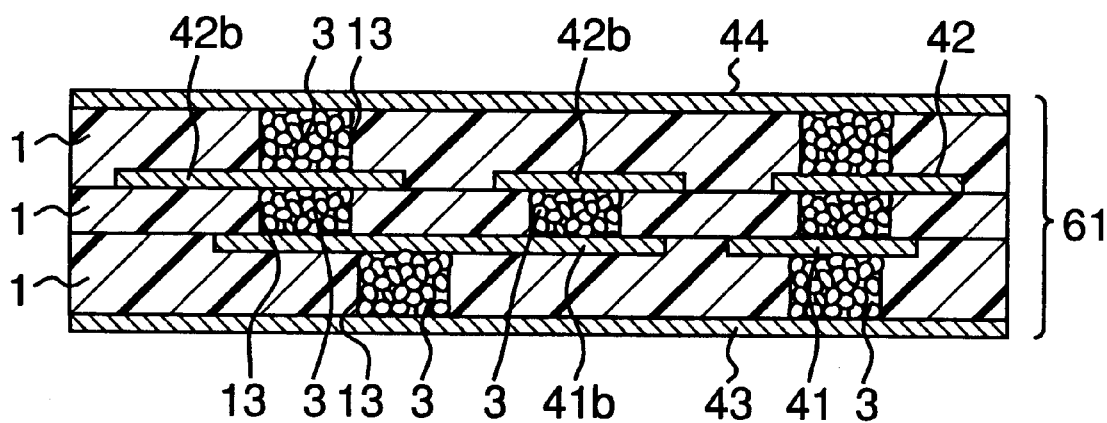
FIG. 3B is a sectional diagram of a circuit board laminating the substrates shown in FIG. 3A.

There is shown in FIGS. 3A and 3B a process for forming a multi-layered printed board 61 by repeatedly using the above-described method forming for a printed circuit board 6, wherein, in FIG. 3A, prepregs 10, 10 with through holes 13 filled with conductive paste as already shown in FIG. 2B are laminated on both sides (upper and lower face) of the core printed board 6, and on both sides of which there are further deposited copper foils 4, 4 in an opposing manner. In this condition, when the prepregs and a base material are heated and pressed from the copper foils 4, 4 on the upper and lower sides, a multi-layered printed board 61 can be obtained with their electrodes 41b, 42b between the base material layer connected through the inner via hole conductors 3 as shown in FIG. 3B. By further etching copper foils 43, 44 on the upper and lower sides into electrodes of a desired pattern, the multi-layered printed board 61 according to this embodiment comprising four layers is completed. If required, this process may be repeated to obtain a multi-layered printed board comprising even more layers.

It was the case with the method for forming a multi-layered printed board of this example as shown in FIG. 3, whereas it is not necessarily required to employ the double-sided printed board as shown in FIG. 1 as a core double-sided printed substrate. It may easily be understood that a conventional double-sided printed board having through holes may also be used. In this case, it is preferable that the through holes are preliminarily blocked. Needless to say, ceramic substrates and other substrates may also be used besides through hole substrates.

(Embodiment 1)

As a prepreg of a printed wiring board, a sheet of an outer size of 500×500 mm obtained by impregnating epoxy resin to an aramid non-woven fabric (manufactured by Teijin Ltd., product name "TA-01") of a thickness of 200 $\mu$m is employed. On both sides of the prepreg, a polyethylene film of a thickness of 20 $\mu$m is attached by using a heat press at a temperature of 100° C. and a pressure of 10 kg/cm$^2$ so that the epoxy resin does not cure, and many through holes, that is, via holes, of a diameter of 0.2 mm were formed on the prepreg by using drills.

Conductive pastes for via hole filling was prepared by mixing and kneading with three rolls 70–85 wt % of spherical and/or flake-shaped copper metal particles, 0–15 wt % of spherical silica (SiO$_2$) particles of an average particle size of 12 $\mu$m, 3 wt % of bisphenol A type epoxy resin (manufactured by Yuka Shell Epoxy Kabushiki Kaisha, product name "Epicoat 828") and 9 wt % of glycidyl ester type epoxy resin (manufactured by TOTOKASEI CO., LTD., product name "YD-171") as resin components, and 3 wt % of amine adduct curing agent (manufactured by Ajinomoto Co., Inc., product name "MY-24") as a curing agent for the epoxy resin.

The shapes of the copper particles, average particle sizes, specific surface values and paste viscosity values are shown in Table 1. The paste viscosity has been obtained by measuring the paste after preparing the composition in conformity to JIS K-7117 with an E-type viscometer at room temperature at a low rotating speed of 0.5 rpm.

Filling was performed by the following method: by using the polyethylene film on the above prepreg as a mask, 300 g of the above-described conductive paste was surprinted directly onto the polyethylene film by using a polyurethane squeegee in a conventional screen printer and was filled into the via holes from the substrate surface.

The polyethylene film was exfoliated from the prepreg filled with paste, and a copper foil of 35 $\mu$m thickness was pasted on both sides of the prepreg which was heated and pressed by using a heat press at a pressing temperature of 180° C. and a pressure of 50 kgf/cm$^2$ for 60 minutes to obtain a both-sided copper cladded board. The both-sided copper cladded board thus obtained was formed with an electrode pattern by using known etching techniques to obtain a wiring board.

Continuous printing was performed by using respective pastes, and Table 1 shows the number of prepregs which wre printed by the same paste until the viscosity became more than 2×10$^6$ cps and specific resistance values of the inner via hole conductors.

For measuring the specific resistance of inner via hole conductors, the resistance was measured through a four-terminal measuring method by using the wiring formed on the copper foil with the 500 via holes provided serially on the both-sided substrate. A resistance for the copper foils was subtracted from the obtained resistance to obtain a resistance for the 500 via hole conductors, and by further obtaining a filling volume based on the thickness and hole size in the substrate, the specific resistance was obtained through calculation. The specific resistance for the metal copper particles employed in this embodiment was 1.7×10$^{-6}$ $\Omega$·cm.

TABLE 1

| Sampling | Copper particles | | | | Insulating particles | Results of Measurement | | |
| --- | --- | --- | --- | --- | --- | --- | --- | --- |
| | Shape of Powder | Particle size $\mu$m | Specific surface m$^2$/g | Amount of addition wt % | Amount of added Silica wt % | Viscosity 10$^3$ cps | Specific resistance 10$^{-5}$ $\Omega$cm | Printed pages |
| *1 | Spherical | 2.0 | 0.37 | 85 | 0 | 2300 | 7.1 | 120 |
| 2 | | | | 84.5 | 0.5 | 1540 | 3.2 | 150 |
| 3 | | | | 84 | 1.0 | 1205 | 0.5 | 230 |
| 4 | | | | 83 | 2.0 | 680 | 1.3 | 250 |
| 5 | | | | 80 | 5.0 | 420 | 1.2 | 320 |
| 6 | | | | 75 | 10.0 | 310 | 1.4 | 400 |
| 7 | | | | 70 | 15.0 | 110 | 1.6 | S20 |
| 8 | Flake-like | 5.0 | 1.20 | 83 | 2.0 | 120 | 0.5 | 230 |
| 9 | | | | 80 | 5.0 | 40 | 0.4 | 380 |

*Out of range of the claims

It is clear from Table 1 that even if the amount of addition of copper particles was decreased with increase in the amount of silica (SiO$_2$) insulating particles, the paste viscosity decrease and the specific resistance for the inner via hole conductors does not rise but rather falls. Further, the number of continuously printed prepergs increases corresponding to an increase in the amount of the insulating particles. No matter which paste was used, it was possible to obtain the specific resistance of the via hole conductor of low resistance that is less than 10 times as much as specific resistance of copper even though the insulating resin was contained. This also shows that the addition of insulating $SiO_2$ particles has an effect of increasing the contact probability of the copper particles.

(Embodiment 2)

In this embodiment, 80 wt % of copper powder of an average particle size of 2 μm as conductive particles in the conductive paste, 5 wt % each of eight sorts of different insulating particles (silica, alumina, magnesia, calcia, polycyanate, polyimide, polymethyl methacrylate (PMMA) and polystyrene), 12 wt % of bisphenol F-type epoxy resin (manufactured by Yuka Shell Epoxy Kabushiki Kaisha, product name "Epicoat 807") as a resin, and 3 wt % of amine adduct curing agent (manufactured by Ajinomoto Co., Inc., product name "PN-23") as a curing agent were mixed and kneading with three rolls. the pasts were filled and printed to a prepregs similarly to that of Embodiment 1. Types of each insulating particles and paste viscosity values after preparing are shown in Table 2 (the measuring method was the same as that of Embodiment 1).

The conductive pastes were applied to prepregs similarly to those of Embodiment 1 and the wiring boards having conductive inner via holes were likewise formed.

TABLE 2

| Sampling | Insulating particles | | | Results of Measurement | | |
|---|---|---|---|---|---|---|
| | Type | Particle size μm | Amount of addition wt % | Viscosity $10^3$ cps | Specific resistance $10^{-5}$ Ωcm | Printed pages |
| 5 | Silica | 12 | 5 | 420 | 1.2 | 320 |
| 10 | Silica | 16 | 5 | 240 | 2.3 | 390 |
| 11 | Alumina | 10 | 5 | 370 | 1.5 | 260 |
| 12 | Alumina | 15 | 5 | 190 | 1.7 | 310 |
| 13 | Magnesia | 12 | 5 | 280 | 1.1 | 320 |
| 14 | Calcia | 12 | 5 | 210 | 1.2 | 370 |
| 15 | Poly-isocyanate | 10 | 5 | 330 | 1.3 | 420 |
| 16 | Polyimide | 15 | 5 | 380 | 0.8 | 330 |
| 17 | PMMA | 16 | 5 | 400 | 0.8 | 360 |
| 18 | Polystyrene | 14 | 5 | 350 | 0.9 | 330 | copper particles: spherical, average particle size; 2.0 μm, specific surface: 0.37 m²/g, amount of added copper particles: 8 wt % constant There are shown in Table 2, among others, specific resistance values for the inner via hole conductors when using each of the different pastes of different insulating particles. No matter which paste was used, it was possible to obtain with the specific resistance of the via hole conductor a connection of low resistance that is less than 10 times as much as the specific resistance of the copper even though insulating resin was contained.

A heat cycle test was performed for each printed wiring board in this embodiment. In this test, the heating and cooling of the substrate was repeated up to 1,000 cycles (−55° C. to 125° C., 30 minutes each), and changes in via hole resistance values were obtained. As shown in Table 2, changes in via hole specific resistance values remained at less than 10% of the initial specific resistance values, and it can be seen that the reliability of the via holes have not been spoiled. The number of continuously printed prepregs (pages) have also been increased.

(Embodiment 3)

In this embodiment, conductive pastes were obtained by mixing and kneading with three rolls 80 wt % of copper powder of an average particle size of 2 μm used as conductive particles of the conductive paste, 5 wt % of spherical silica ($SiO_2$) particles of an average particle size of 12 μm as insulating particles, total 12 wt % of resin obtained by blending two types of resin selected from group A (bisphenol A-type epoxy resin, bisphenol F-type epoxy resin) and group B (alicyclic epoxy resin, amine type epoxy resin or glycidyl ester type epoxy resin) as an epoxy resin, and 3 wt % of amine adduct curing agent ("MY-24") as a curing agent. These pastes for filling were measured, in the same manner as in Embodiment 1, with an E-type viscometer to obtain viscocity at a low rotation speed of 0.5 rpm at room temperature.

These conductive pastes were printed and filled into prepregs similarly to that of Embodiment 1 and were similarly formed into printed circuit boards having formed on their surfaces electrode patterns.

In this embodiment, a soldering-reflow test was performed as a heat cycle test. That is, 10 cycles of a process in which the printed circuit board is heated for 10 seconds by heat soldering at 260° C. were repeated to measure changes in connection specific resistance values of the via hole conductors.

TABLE 3

| | Resin A | | Resin B | | Results of Measurement | | | |
|---|---|---|---|---|---|---|---|---|
| Sampling | Type | Amount wt % | Type | Amount wt % | Viscosity $10^3$ cps | Specific resistance $10^{-5}$ Ωcm | Reflow changing rate % | Printed pages |
| 19 | Bis A-type | 50 | Alicyclic | 50 | 420 | 1.2 | 2.1 | 320 |
| 20 | | 50 | Amine-type | 50 | 440 | 2.3 | 3.2 | 390 |
| 21 | | 75 | Glycidyl ester | 25 | 370 | 1.5 | 2.1 | 260 |
| 22 | | 50 | | 50 | 240 | 1.7 | 1.1 | 310 |
| 23 | | 25 | | 75 | 180 | 1.1 | 0.7 | 420 |
| 24 | Bis F-type | 75 | | 25 | 210 | 1.2 | 1.8 | 370 |
| 25 | | 50 | | 50 | 180 | 0.8 | 1.1 | 480 |
| 26 | | 25 | | 75 | 130 | 0.9 | 0.5 | 630 |

Specific resistance values of the inner via hole conductors, results of the soldering-reflow test and the number of continuously printed perpergs (pages) are shown in Table 3.

No matter which paste was used, it was possible to obtain with the specific resistance of the via hole conductor a connection of low resistance that is at less than 10 times as much as specific resistance of copper even though insulating resin was contained.

The changes in specific resistance of the via hole conductors after repeating 10 cycles of the soldering-reflow test (260° C., 10 seconds) was at less than 10% of the initial specific resistance, and the reliability of the via holes was not spoiled. Especially in a group to which a glycidyl ester group was mixed, the changing rate of the resistance was less than 2% as the glycidyl ester group is contained in the amount of more than 10%, and it can be understood that the reliability of the via hole connection using these conductive pastes is extremely high.

(Embodiment 4)

In this embodiment, a conductive paste was obtained by mixing and kneading with three rolls 75–85 wt % of copper powder of an average particle size of 2 µm as metal particles for the conductive paste, 5–10 wt % of either spherical silica (SiO$_2$) particles of a diameter of 12 µm with Au plated surfaces or divinyl benzene resin particles of 10 µm with Au plated surfaces (manufactured by Sekisui Chemical, Co., Ltd., product name "Micropearl AU-210") as insulating particles, total 12 wt % of blended resin obtained from 25 parts by weight of bisphenol A-type epoxy resin and 75 parts by weight of glycidyl ester group epoxy resin as liquid epoxy resin, and 3 wt % of amide adduct curing agent ("MY-24" as above) as a curing agent. Similarly to Embodiment 1, the low speed rotation viscosity of the via hole filling paste was measured at room temperature.

These conductive pastes were printed and filled to prepregs similarly to those of Embodiment 1, and were similarly formed into printed circuit boards. Values for the paste viscosity, specific resistance values of the inner via hole conductors and the number of continuously printed pages are shown in Table 4.

(Embodiment 5)

In this embodiment, the effect of solvents in the paste was checked, and a conductive paste was obtained by mixing and kneading with three rolls 80 wt % of copper powder of an average particle size of 2 µm as conductive particles, 5 wt % of spherical SiO$_2$ insulating particles of an average particle size of 12 µm, total 7–12 wt % of resin blended in a ratio of 25:75 of bisphenol A-type epoxy resin and glycidyl ester type epoxy resin, 3 wt % of amine adduct curing agent (manufactured by Ajinomoto Co., Inc., product name "MY-24") as a curing agent, and 0–5 wt % of solvent that is one selected from ethyl carbitol (EC), butyl carbitol (BC), butyl carbitol acetate (BCA), and 2-2-4 trimethylpentanediol monoisobutylate (MIBE). Similarly to Embodiment 1, these pastes were printed and filled into prepresg to form printed wiring boards.

TABLE 5

| Sampling | Amount of epoxy resin (%) | Type of solvent | Amount of solvent (%) | Viscosity $10^3$ cps | Specific resistance $10^{-5}$ Ωcm | Printed pages |
| --- | --- | --- | --- | --- | --- | --- |
| 29 | 12.0 | None | 0 | 420 | 0.7 | 320 |
| 32 | 11.5 | EC | 0.5 | 240 | 0.8 | 560 |
| 33 | 11.5 | BC | 0.5 | 210 | 1.1 | 770 |
| 34 | 11.5 | BCA | 0.5 | 180 | 1.3 | 720 |
| 35 | 11.5 | MIBE | 0.5 | 240 | 1.4 | 450 |
| 36 | 11.9 | BCA | 0.1 | 310 | 1.1 | 400 |
| 37 | 11.0 | BCA | 1.0 | 140 | 1.5 | 550 |
| 38 | 10.0 | BCA | 2.0 | 110 | 2.5 | 790 |
| *39 | 7.0 | BCA | 5.0 | 40 | 6.4 | 1220 |

Notes:
copper particles; spherical, 2.0 µm 80 wt % insulating particles; spherical silica, 12 µm 5 wt % resin; bis A epoxy + glycidylester epoxy, 25% curing agent; amine adduct, 3 wt %
*Out of range of the claims Values for the paste viscosity at room temperature, specific resistance values of the inner via holes, and number of continuously printed prepregs (pages) for each of the paste are indicated in Table 5. No matter which solvent was used, it was possible to obtain with the specific resistance of the

TABLE 4

| Sampling | Amount of added Cu wt % | Type of insulating particles | Au plated | Amount wt % | Viscosity $10^3$ cps | Specific resistance $10^{-5}$ Ωcm | Printed pages |
| --- | --- | --- | --- | --- | --- | --- | --- |
| 27 | 80 | Spherical silica | YES | 5 | 230 | 0.7 | 430 |
| 28 | 75 | Spherical silica | YES | 10 | 130 | 0.4 | 550 |
| 29 | 80 | Spherical silica | NO | 5 | 420 | 1.2 | 320 |
| 30 | 80 | Divinyl benzene | YES | 5 | 320 | 0.8 | 380 |
| 31 | 75 | Divinyl benzene | YES | 10 | 260 | 0.3 | 440 |

With a group employing insulating particles with Au plated surfaces, a connection of even lower specific resistance than compared to that of Embodiment 1 was obtained. Changes in viscosity at continuous printing were also made more stable. This is because the Au layer on the insulating particle surfaces presents poor affinity with the above-described mask due to their poor reactivity and wettability with epoxy resin, and consequently results in a small amount of resin remaining on the mask. It is considered that such insulating particles enable connection of low resistance since they improve the contact probability of copper particles and also present favorable surface conductivity.

via hole conductor a connection of low resistance that is at less than 10 times as much as the specific resistance of the copper even though insulating resin was contained.

A sampling in which more than 2% of solvent was added resulted in a low viscosity but in a high connection specific resistance, and no stable reliability could be obtained. The number of continuously printed pages remarkably increased through the addition of a solvent. This is because the addition of solvents improved the sliding of the squeegee on the printing mask and caused a decrease in resin amount remaining at the mask.

By addition of a solvent alone to a group of metal particles and liquid epoxy resin as had been conventionally performed, no via hole connection of low resistance could be obtained though the viscosity could be decreased.

However, with a group containing coarsened insulating particles as in this embodiment, the presence of the coarse-grained insulating particles enabled a favorable via hole connection even when a solvent was contained, and continuous printability could be exhibited as well.

(Embodiment 6)

The effect of a curing agent in the paste was checked in this Embodiment, and conductive pastes were obtained by milling, similarly to Embodiment 1, with three rolls 80 wt % of copper powder of an average particle size of 2 μm as conductive particles of the conductive paste, 5 wt % of spherical $SiO_2$ insulating particles of an average particle size of 12 μm, total 8–14.5 wt % of resin blended in a weight ratio of 25:75 of bisphenol A type epoxy resin and glycidyl ester type epoxy resin, and either phthalic anhydride or amide adduct type curing agent ("MY-24" as above) in a range of 0.5–7 wt % as a curing agent. These pastes were filled into prepregs formed with through holes of 0.2 mm in diameter.

TABLE 6

| Sampling | Type of curing agent | Amount of curing agent wt % | Viscosity $10^3$ cps | Specific resistance $10^{-5}$ Ωcm | Printed pages |
|---|---|---|---|---|---|
| 40 | Anhydride | 0.5 | 120 | 0.5 | 540 |
| 41 | | 3.0 | 100 | 1.6 | 600 |
| 42 | | 5.0 | 80 | 2.2 | 650 |
| *43 | | 7.0 | 30 | 6.6 | 1050 |
| 44 | Amine | 0.5 | 150 | 0.8 | 660 |
| 45 | adduct | 3.0 | 220 | 0.7 | 530 |
| 46 | | 5.0 | 750 | 2.2 | 430 |
| *47 | | 7.0 | 2250 | 2.0 | 50 |

*Out of range of the claims

Values for the paste viscosity at room temperature, specific resistance values of the inner via holes, and number of continuously printed pages for each of the paste are indicated in Table 6. No matter how the weight ratio of the curing agent was, it was possible to obtain with the specific resistance of the via hole conductor a connection of low resistance that is at less than 10 times as much as specific resistance of copper even though insulating resin was contained with all of the pastes.

However, in a case of a solid powder such as amine adduct curing agent, the paste viscosity increased with increase in adding amount of the agent, and as in a paste the amount of curing agent exceeded 5 wt %, operation of filling via holes becomes difficult. In case of a curing agent having a large volatility such as acid anhydride, a satisfactory double-sided copper cladded board could not be obtained when the amount of volatility exceeded 2% because blisters occurred in the substrate and the electrodes.

(Embodiment 7)

In this embodiment, a conductive paste was obtained by mixing and kneading with three rolls 80 wt % of copper powder of an average particle size of 2 μm as conductive particles, 5 wt % of spherical $SiO_2$ insulating particles of an average particle size of 12 μm, total 11.5 wt % of resin blended in a weight ratio of 25:75 of bisphenol A-type epoxy resin and glycidyl ester type epoxy resin, 3 wt % of amine adduct curing agent ("MY-24", as above) as a curing agent, and 0.5 wt % of BCA solvent. The conductive paste was filled into a prepreg formed with through holes of 0.2 mm in diameter to form an aramid-epoxy resin complex prepreg.

Two separate aramid-epoxy double-sided substrates were obtained by forming a pattern for measuring a connection resistance similarly to Embodiment 1. The above prepreg was pinched between these substrates, and they were heated and pressed with a heat press at a press temperature of 180° C. and a pressure of 50 kg/cm² for 60 minutes to obtain a four-layered substrate.

The connection resistance of the inner via holes formed between the second and third layers of the four-layered substrate presented the same resistance values that were those of Embodiment 1. Similarly, for a six-layered printed board, the connection resistance value and reliability were also similar to those of the four-layered one.

Both sides of one aramid-epoxy substrate obtained by using the above-described paste and the same method as in Embodiment 1 are pinched with two aramid-epoxy prepregs which where through holes of 0.2 mm in diameter have been filled with this paste, and they were then heated and pressed by using a heat press at a pressing temperature of 180° C. and a pressure of 50 kg/cm² for 60 minutes to obtain a four-layered printed board. This four-layered printed board presented similar via hole connection resistance values. A six-layered printed board obtained by this method presented similar reliabilities.

Also in a case in which the aramid-epoxy double-sided substrate obtained by the same methods as in Embodiment 1 was substituted with a ceramic substrate with a circuit formed thereon, the same reliability in via hole connection resistance could be obtained.

As explained so far, the conductive paste for via hole filling according to the present invention has the effect of decreasing the amount of minute copper particles added which determine the viscosity without decreasing their contact probability among the particles by the addition of specifically coarse insulating particles, whereby the stability of paste viscosity at multiple continuous printing can be improved.

Further, the addition of a small amount of solvent of high boiling point is effective in decreasing the viscosity of the paste, prevents occurrence of deficiencies such as blisters in substrates at the time of thermosetting, secures reliability of via hole connection as well as stability of viscosity accompanying the addition of coarse insulating particles, and improves the printing and filling performance of the conductive paste.

According to the printed circuit board employing the conductive paste of the present invention, a printed circuit board that exhibits low specific resistance of via hole conductors and high reliability of via hole connection can be simply and easily realized without employing through-hole metalizing techniques, and laminating the substrates can also be easily realized.

What is claimed is:

1. A conductive paste composition for via hole filling, comprising;
    (a) 70–90 wt % of copper particles of an average particle size of 0.5–8 μm;
    (b) 0.5–15 wt % of insulating particles of an average particle size of 10–20 μm; and,
    (c) 6–17 wt % of thermosetting type liquid epoxy resin.

2. A conductive paste composition for via hole filling, having a viscosity of less than $2 \times 10^6$ cps and comprising:
    (a) 70–90 wt % of copper particles of an average particle size of 0.5–8 μm, a specific surface of 0.1–1.5 m²/g and a surface oxygen density of less than 1.0 wt %;
    (b) 0.5–15 wt % of insulating particles of an average particle size of 10–20 μm;
    (c) 6–17 wt % of liquid epoxy resin; and,
    (d) 0.5–5 wt % of curing agent.

3. A conductive paste composition for via hole filling having a viscosity of less than $2 \times 10^6$ cps and necessarily, comprising:

(a) 70–90 wt % of copper particles of an average particle size of 0.5–8 μm, a specific surface of 0.1–1.5 m$^2$/g and a surface oxygen concentration of less than 1.0 wt %;

(b) 0.5–15 wt % of insulating particles of an average particle size of 10–20 μm; and (c) 6–17 wt % of liquid epoxy resin;

(d) 0.5–5 wt % of curing agent; and, (e) 0.1–2 wt % of solvent.

4. The conductive paste composition for via hole filling according to any one of claims 1 to 3, wherein the insulating particles are formed of inorganic material.

5. The conductive paste composition for via hole filling according to any one of claims 1 to 3, wherein the insulating particles are formed of one or more of inorganic materials selected from silicon oxide, magnesium oxide, aluminum oxide and calcium oxide.

6. The conductive paste composition for via hole filling according to any one of claims 1 to 3, wherein the insulating particles are formed of synthetic resin with a softening temperature of more than 100° C.

7. The conductive paste composition for via hole filling according to any one of claims 1 to 3, wherein the insulating particles are one or more selected from silicone resin, polyisocyanate resin, polyimide resin, aromatic vinyl resin, and acrylic resin.

8. The conductive paste composition for via hole filling according to any one of claims 1 to 3, wherein the liquid epoxy resin includes more than 10 parts by weight of epoxy compounds obtained by glycidyl esterifying dimeric acid.

9. The conductive paste composition for via hole filling according to claim 2 or 3, wherein the curing agent is of a latent type.

10. The conductive paste composition for via hole filling according to claim 3, wherein the solvent is compatible with the liquid epoxy resin and has a boiling point of more than 200° C.

11. The conductive paste composition for via hole filling according to claim 3, wherein the solvent is one or more selected from ethyl carbitol, butyl carbitol, butyl carbitol acetate, and 2-2-4 trimethylpentanediol monoisobutylate.

12. A printed circuit board having at least one insulating material layer and more than two electrode layers and having via hole conductors formed by filling the conductive paste composition as claimed in any one of claims 1 to 3 into via holes passed through the insulating material layers, wherein the via hole conductors provide electric connection between the electrode layers.

13. The printed circuit board according to claim 12, wherein the insulating material layer is a composite material comprising fibrous reinforcing material and thermosetting resin.

14. The printed circuit board according to claim 12, wherein the insulating material layer is a composite material of aramid non-woven fabric and epoxy resin.

* * * * *